United States Patent [19]

Balyasny

[11] Patent Number: 5,423,688
[45] Date of Patent: Jun. 13, 1995

[54] CLIP FOR SMALL OUTLINE IC DEVICE
[75] Inventor: Marik Balyasny, Burbank, Calif.
[73] Assignee: ITT Industries, Inc., Santa Ana, Calif.
[21] Appl. No.: 169,684
[22] Filed: Dec. 17, 1993
[51] Int. Cl.⁶ .................................... H01R 23/72
[52] U.S. Cl. ............................. 439/70; 324/754; 439/912
[58] Field of Search .................... 439/68–73, 439/912, 67, 77; 324/754, 537

[56] References Cited

U.S. PATENT DOCUMENTS

| | | | |
|---|---|---|---|
| 3,399,452 | 9/1968 | Reid | 29/882 |
| 3,506,949 | 4/1970 | Venaleck et al. | 339/174 |
| 4,055,806 | 10/1977 | Patel | 324/158 |
| 4,190,311 | 2/1980 | Basta | 339/75 |
| 4,508,403 | 4/1985 | Weltman et al. | 339/28 |
| 4,541,676 | 9/1985 | Hansen et al. | 339/17 |
| 4,574,235 | 3/1986 | Kelly et al. | 324/158 |
| 4,632,485 | 12/1986 | Brown et al. | 339/75 |
| 4,735,580 | 4/1988 | Hansen et al. | 439/264 |
| 4,797,118 | 1/1989 | Feamster | 439/264 |
| 4,816,751 | 3/1989 | Seiichi et al. | 324/73 |
| 4,822,295 | 4/1989 | Porter | 439/330 |
| 4,833,404 | 5/1989 | Meyer et al. | 324/158 |
| 4,835,469 | 5/1989 | Jones et al. | 324/158 |
| 4,907,976 | 3/1990 | Killcommons | 439/72 |
| 4,970,460 | 11/1990 | Jensen et al. | 324/158 |
| 4,978,912 | 12/1990 | Vonder et al. | 324/158 |
| 4,996,476 | 2/1991 | Balyasny et al. | 324/158 |
| 5,042,971 | 8/1991 | Ambrose | 439/77 |
| 5,087,877 | 2/1992 | Frentz et al. | 324/158 |
| 5,104,327 | 4/1992 | Walburn | 439/492 |
| 5,151,653 | 9/1992 | Yutori et al. | 324/158 |
| 5,166,609 | 11/1992 | Cole et al. | 324/158 |
| 5,202,622 | 4/1993 | Cole et al. | 324/158 |
| 5,205,741 | 4/1993 | Steen et al. | 439/70 |

FOREIGN PATENT DOCUMENTS 0208577 8/1990 Japan .

Primary Examiner—Neil Abrams
Attorney, Agent, or Firm—Freilich Hornbaker Rosen

[57] ABSTRACT

A clip is described for making connections to the leads of an IC device whose leads are very closely spaced, which can be constructed reliably and at low cost. The clip includes a flat cable (112, FIG. 8) mounted on a clip frame (44), the cable having parallel conductors (114) mounted on a continuous insulative film (116), with lower portions of the conductors exposed to serve as lead-engaging contacts (50). The film is thin in a lateral direction (154) to easily bend and allow differential deflection of the contacts, while the conductors are thick in a lateral direction to minimize the influence of the film on conductor deflection. The frame of the clip has a cavity (46) with side and end walls that closely align with the body (14) of the IC device without an interference fit thereto. A pair of pivoting arms (34, 36, FIG. 2) press against the opposite ends of an IC device to lock the clip but not to align it. A contact arrangement that includes the flat cable, includes a header (122, FIG. 3) whose housing has an inner surface lying facewise against the flat cable and with the flat cable lying facewise against a largely vertical flat surface (132) on the frame.

10 Claims, 9 Drawing Sheets

CLIP FOR SMALL OUTLINE IC DEVICE

BACKGROUND OF THE INVENTION

Clips such as test clips are used to temporarily or indefinitely connect to the leads of an IC (integrated circuit) device, such as one with leads that project from opposite sides of the IC device. Recently available miniature SOP (small outline package) IC devices have lead pitches (center-to-center spacings) of 1 mm or less, with lead pitches of 0.5 mm (0.02 inch) currently available. It is expected that IC devices will soon be available with lead pitches of 0.4 mm and 0.3 mm. As the pitch size decreases, it is impractical to provide stationary barriers between flexing contacts.

One approach that enables the close spacings of small individually flexed contacts involves the use of a flat flexible cable. Such a cable includes conductors formed from a piece of sheet metal bonded to an insulative carrier sheet, with strip-shaped regions of the sheet metal having been etched away to leave closely spaced parallel conductors. The lower ends of the conductors are exposed at one side and serve as contacts to engage the leads of the IC device. When available flat flexible cables are constructed with one side of the lower ends of the conductors exposed, it is found that the carrier sheet prevents considerable individual deflection of the lower ends of the conductors. Each conductor lower end must be able to deflect largely independently of adjacent conductors, to assure engagement with all leads of the IC device.

Applicant has earlier left both surfaces of the conductor lower portions free of carrier sheets so each conductor lower portion can flex independently. However, the free conductor lower portions are subject to being damaged by deformation during handling. It would be desirable if the lower ends of the individual conductors could individually flex while still being protected against damage.

Other desirable features for a clip is that it be capable of being accurately aligned with the body of an IC device and be held or locked thereto. Also, it is desirable if the flat cable could be connected to a header in a simple manner that avoided or minimized flexing of the cable while securely and simply holding the header.

SUMMARY OF THE INVENTION

In accordance with one embodiment of the present invention, a clip is provided for engaging the leads of an IC device or the like, which can be easily manufactured with very closely spaced contacts, which provides flexibility for the contacts while protecting them, which provides a simple and easily installed contact arrangement, and which can accurately align and securely temporarily hold to an IC device. The clip includes a flat cable having a group of elongated conductors held in a fixed relationship by a carrier film, with at least one side of each conductor lower end being exposed. In one clip, one side of the conductor lower ends are protected by the film, but the film is very thin compared to the thickness of the conductors so the film provides minimal impediment to individual flexing of the conductor lower end portions. In another arrangement, both sides of the conductor lower ends are exposed, and the conductor lower ends may be bent into a loop.

The flat cable can be part of a contact arrangement that includes a header connected to the upper end of the cable, with the upper end of the cable that lies against the header housing, being supported on a flat largely vertical surface of the clip frame which supports most of the rest of the flat cable.

The frame of the clip includes a cavity at its lower end, with opposite cavity side and end walls that closely surround the body of the IC device to align the clip with the body. At least one pivoting arm of the clip can be released to press against a lower portion of the body end to lock the clip on the body.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
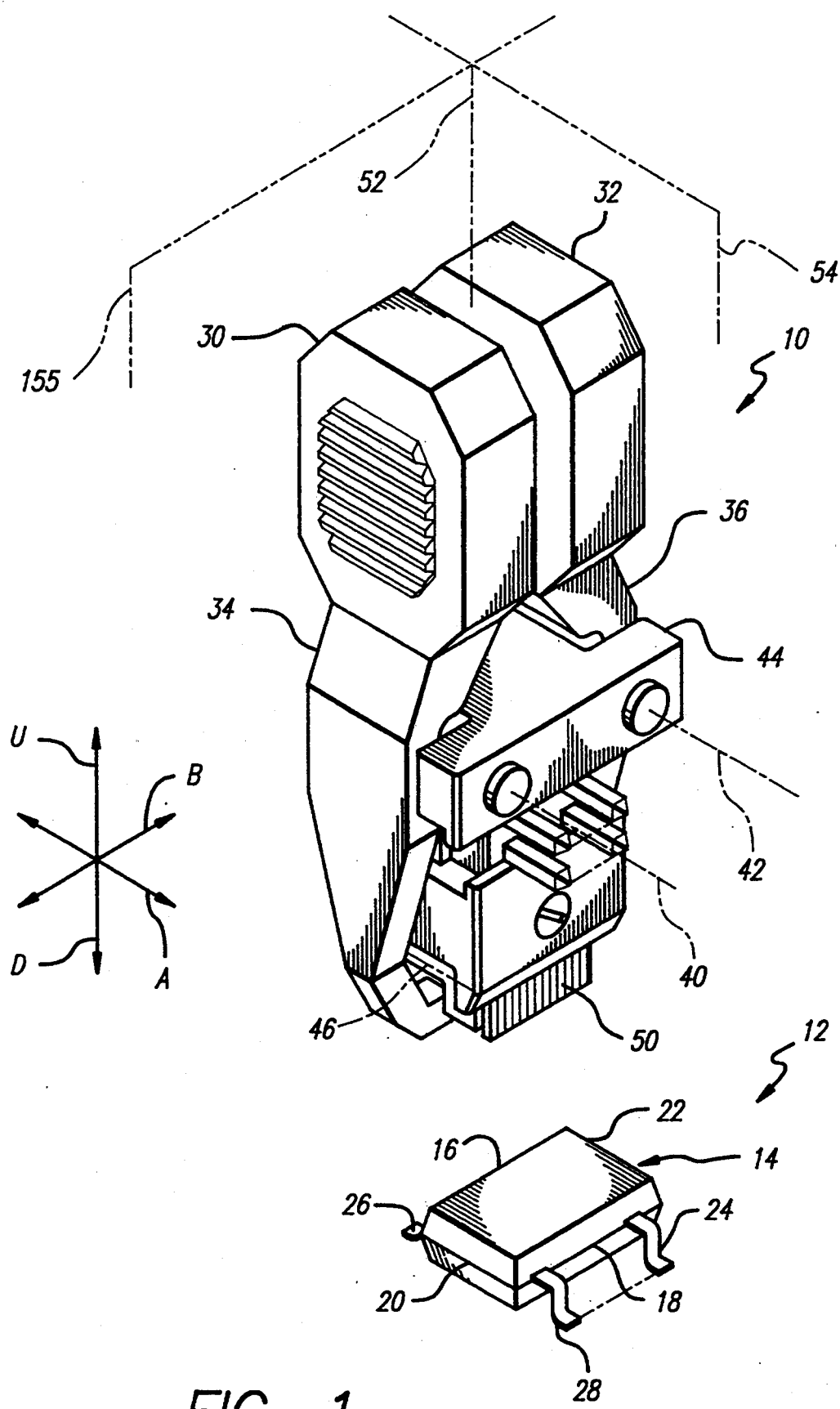
FIG. 1 is an isometric view of a test clip constructed in accordance with the present invention, showing it lying above an IC device with which it can mate.

FIG. 1 shows a test clip 10 of the present invention, which can be lowered onto a IC (integrated circuit) device 12 of the SOP (small outline package) type, which has been mounted on a circuit board (not shown). The IC device includes a dielectric body 14 having opposite sides 16, 18 spaced apart along lateral directions A, and opposite ends 20, 22 spaced apart along longitudinal directions B. The device has leads 24 arranged in two rows 26, 28 that project from the opposite sides. The clip 10 has a pair of handles 30, 32 located on lock arms 34, 36 that are pivotally mounted about laterally-extending pivot axes 40, 42 on a frame 44 of the clip. The frame has a cavity 46 with walls that align the clip frame with the IC device body 14, so rows of contacts 50 of the clip can engage the leads 24 on the IC device. With the handles 30, 32 of the clip pressed together, the clip is moved in a downward direction D along its axis 52 to engage the IC device. The handles 30, 32 are then released so that lower ends of the arms can lock to the IC device.

Figure 2:
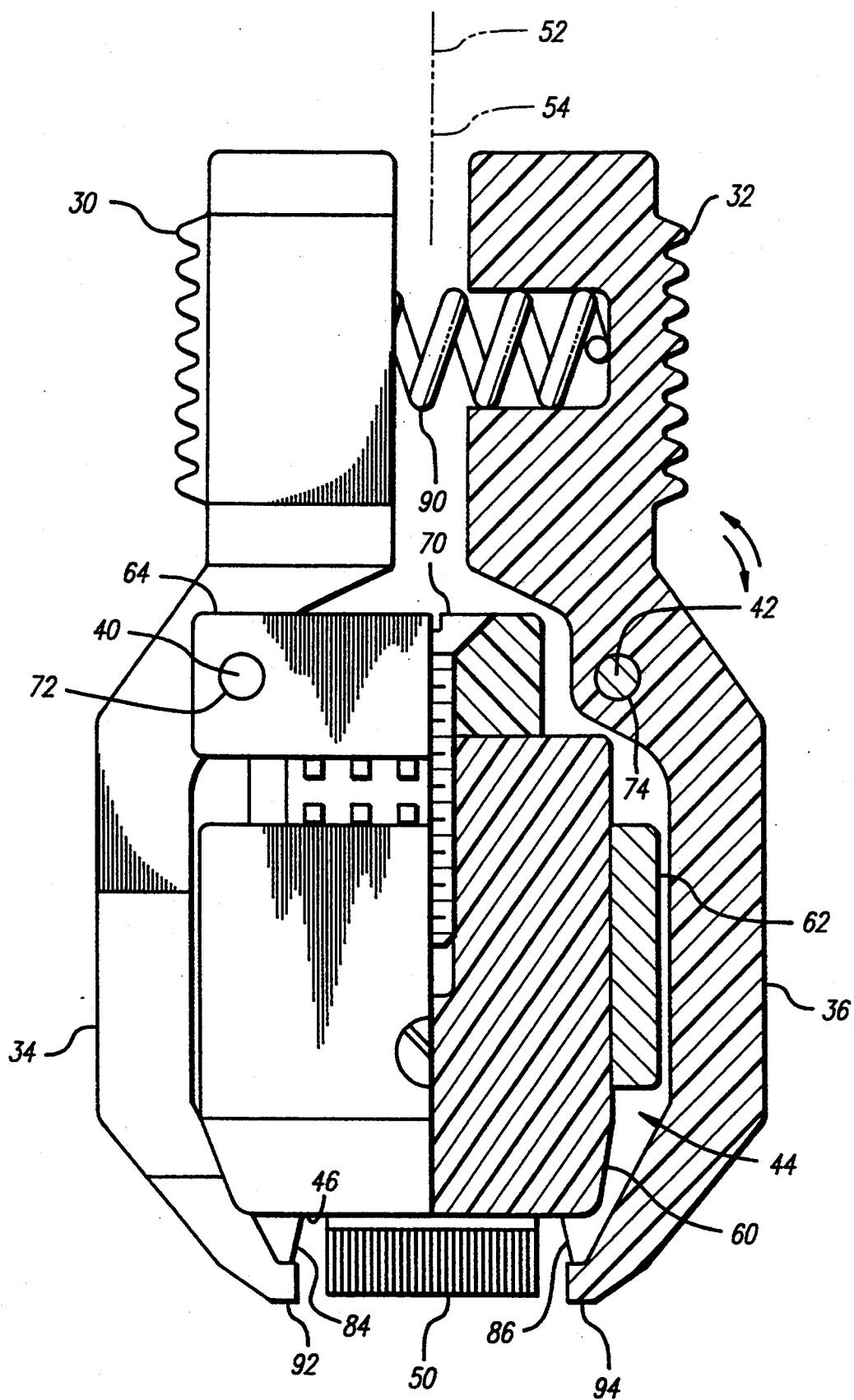
FIG. 2 is a side view of the clip of FIG. 1, with the right half of the figure being a sectional view and the left half being an elevation view.
Figure 3:
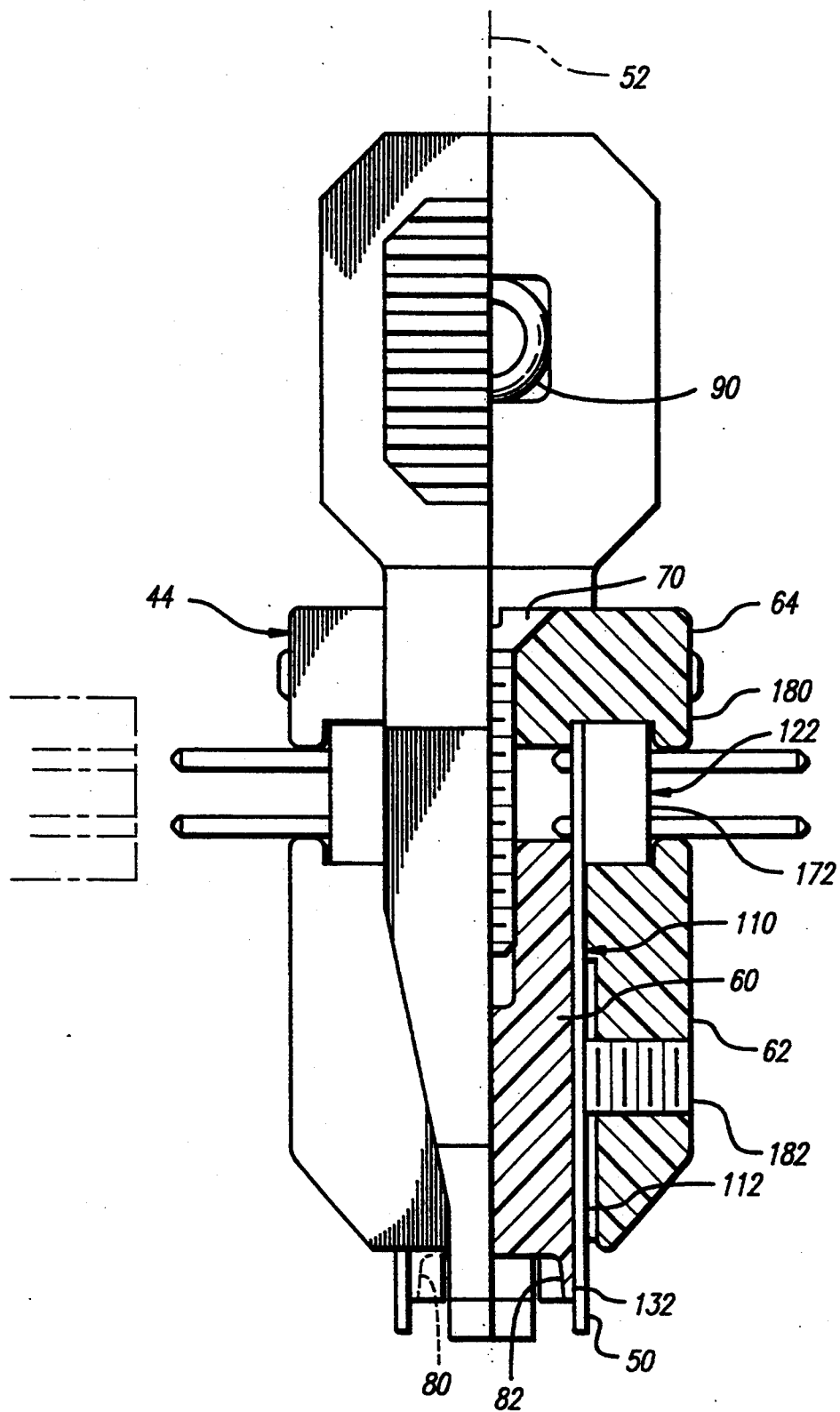
FIG. 3 is an end view of the clip of FIG. 1, with the right half of the figure being a sectional view and the left half being an elevation view.
Figure 5:
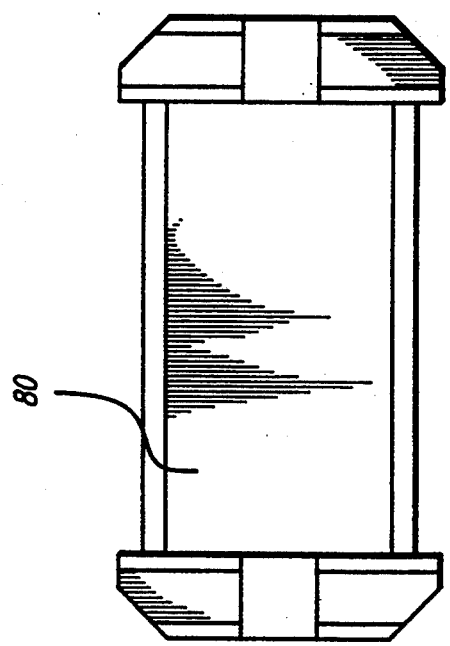
FIG. 5 is a bottom view of the frame of the clip of FIG. 1.
Figure 4:
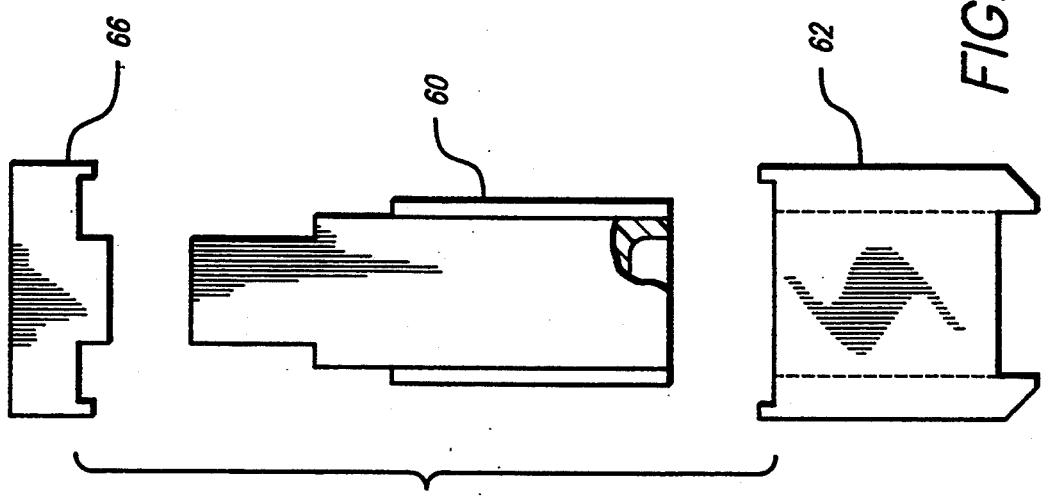
FIG. 4 is an exploded end elevation view of the frame of the clip of FIG. 1.

As shown in FIGS. 2 and 3, the frame 44 of the clip includes a base 60 that forms the cavity 46, a hood 62 that surrounds the base and has walls lying outside the base (i.e. further from the clip axis 52 than most of the base), and an upper part 64 that mounts on the base by means of a bolt 70. The arms 34, 36 are pivotally mounted by shafts 72, 74 on the upper part of the frame.

The cavity 46 forms opposite cavity sidewalls 80, 82 that are designed to lie closely adjacent to the opposite sides 16, 18 of the IC device without interference therewith. The cavity also includes cavity end walls 84, 86 that also are designed to lie closely adjacent to the opposite ends of the IC device but not at interference fit therewith. The cavity side and end walls provide precision alignment with the body of the IC device so as to assure that the contacts 50 of the IC device will properly contact the leads of the IC device.

Figure 6:
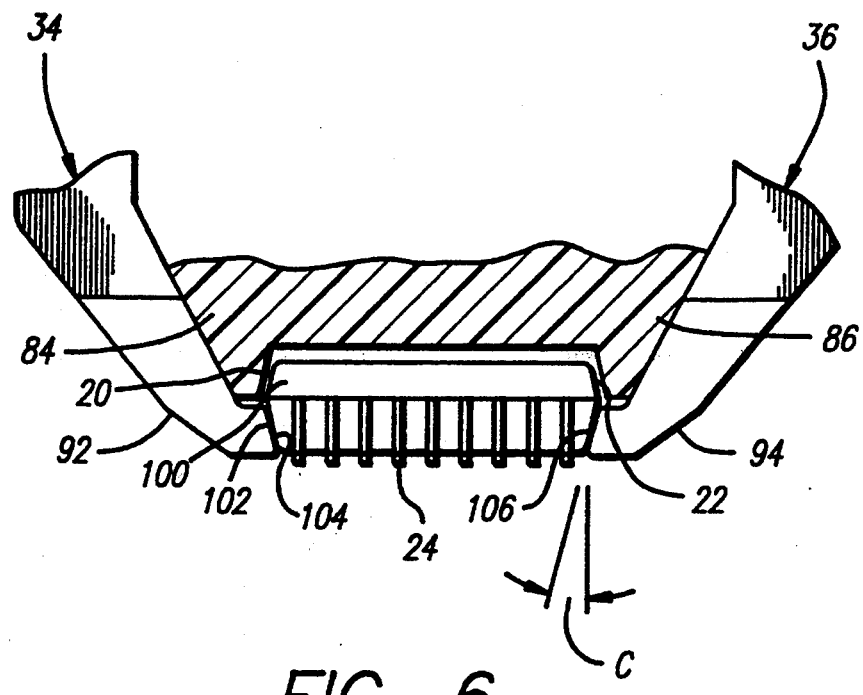
FIG. 6 is a sectional view of the lower portion of the clip of FIG. 2, showing it fully engaged with an IC device.
Figure 7:
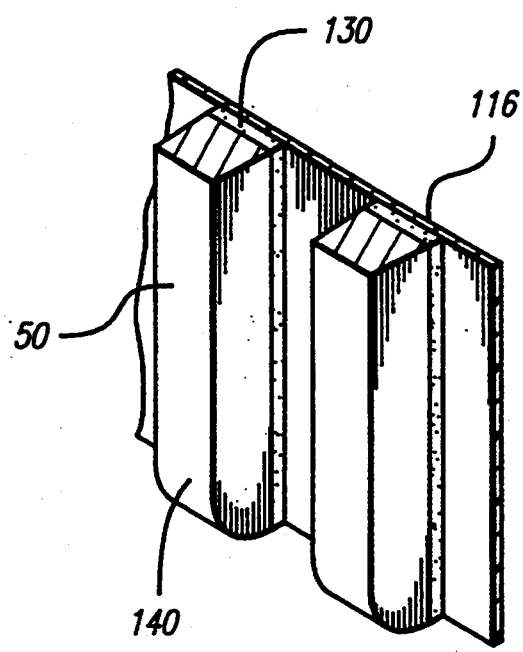
FIG. 7 is an enlarged partial view of the contact arrangement of the clip of FIG. 3.

When the clip is lowered and the cavity walls closely align the clip with the body of the IC device, the handles 30, 32 are released to allow the lock arms 34, 36 to pivot under the force of a spring 90. During such pivoting, lower ends 92, 94 of the arms move towards each other to engage the opposite ends of the body of the IC device. In other words, the arms move inwardly, closer to the axis 52, and to a laterally-extending centerplane 54 that passes through the axis. FIG. 6 shows the manner in which the arm lower ends 92, 94 engage the body ends 20, 22. The body ends include upper and lower parts 100, 102. The lower parts 102 are angled at an angle C of a plurality of degrees from the vertical, such as 7°, with the lower parts converging in a downward direction. Such angling allows the lower part of the body to be removed from an injection mold during forming of the IC device. Each arm lower end has a body-engaging surface 104, 106 which is also angled from the vertical by about the same angle as the body end lower part. As discussed above, the cavity walls such as the cavity end walls 84, 86 are used to precisely align the clip frame with the IC device body. The surfaces 104, 106 of the arm do not align the clip with the IC device, but merely serve to lock, or firmly hold, the arms and therefore the rest of the clip to the IC device. Such a holding is due primarily to the inward force of the arm surfaces against the ends of the body, which is due to the force of the spring that separates the tops of the arms, with the downward angling of the arm surfaces 104, 106 helping to hold the clip by requiring the arms to be separated before the clip can be moved off the IC device. By separating the aligning function (of cavity walls) from the locking or holding function (of the arms), applicant uses only nonmoving walls for alignment, which results in accurate alignment in a low cost construction. The arms are accurately mounted, but do not require very high precision. A single arm such as 34 will hold the clip, but two arms are better.

Figure 11:
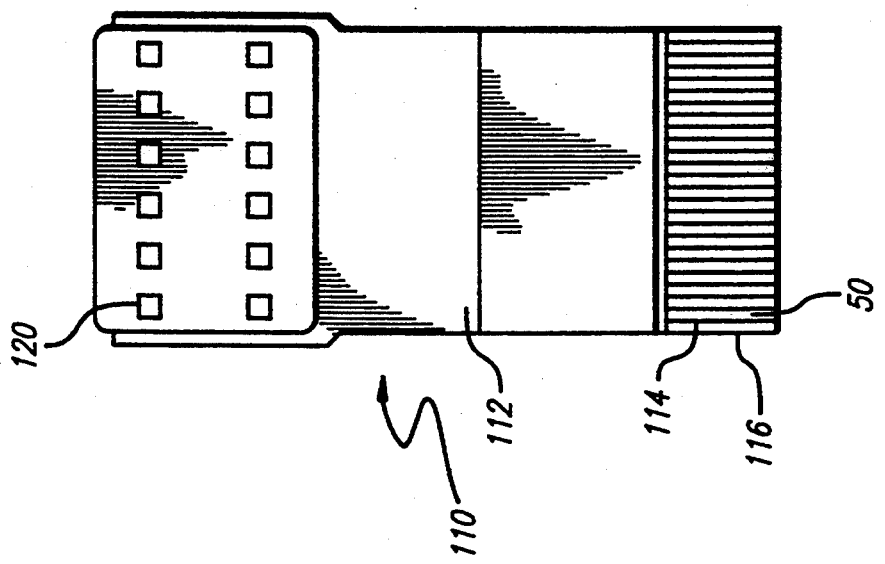
FIG. 11 is a side elevation view of the contact arrangement of FIG. 10.
Figure 10:
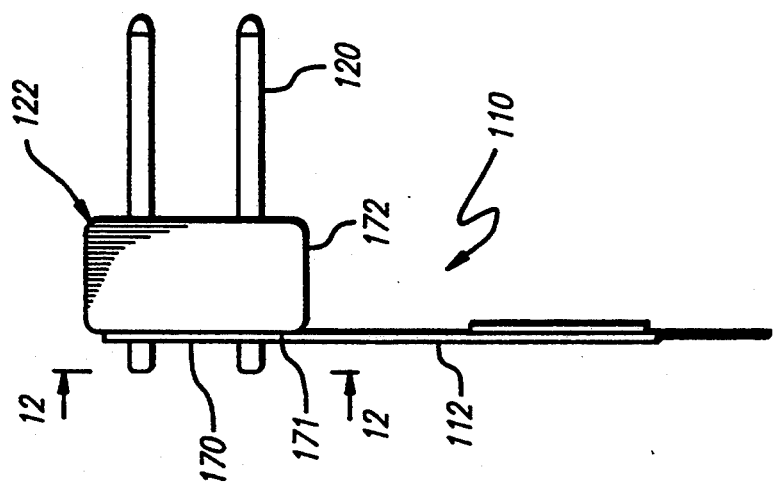
FIG. 10 is an end elevation view of one of the contact arrangements of the clip of FIG. 3.

FIG. 3 shows that the contact ends 50 are portions of conductors of a contact arrangement 110. As shown in FIGS. 10 and 11, the contact arrangement 110 includes a flat cable 112 with a group of conductors 114 held on a carrier film 116. The conductors have lower end portions forming the contacts 50, with the conductors being exposed at the lower end portions. The upper end portions of the contacts are connected to terminals 120 of a header 122.

Figure 8:
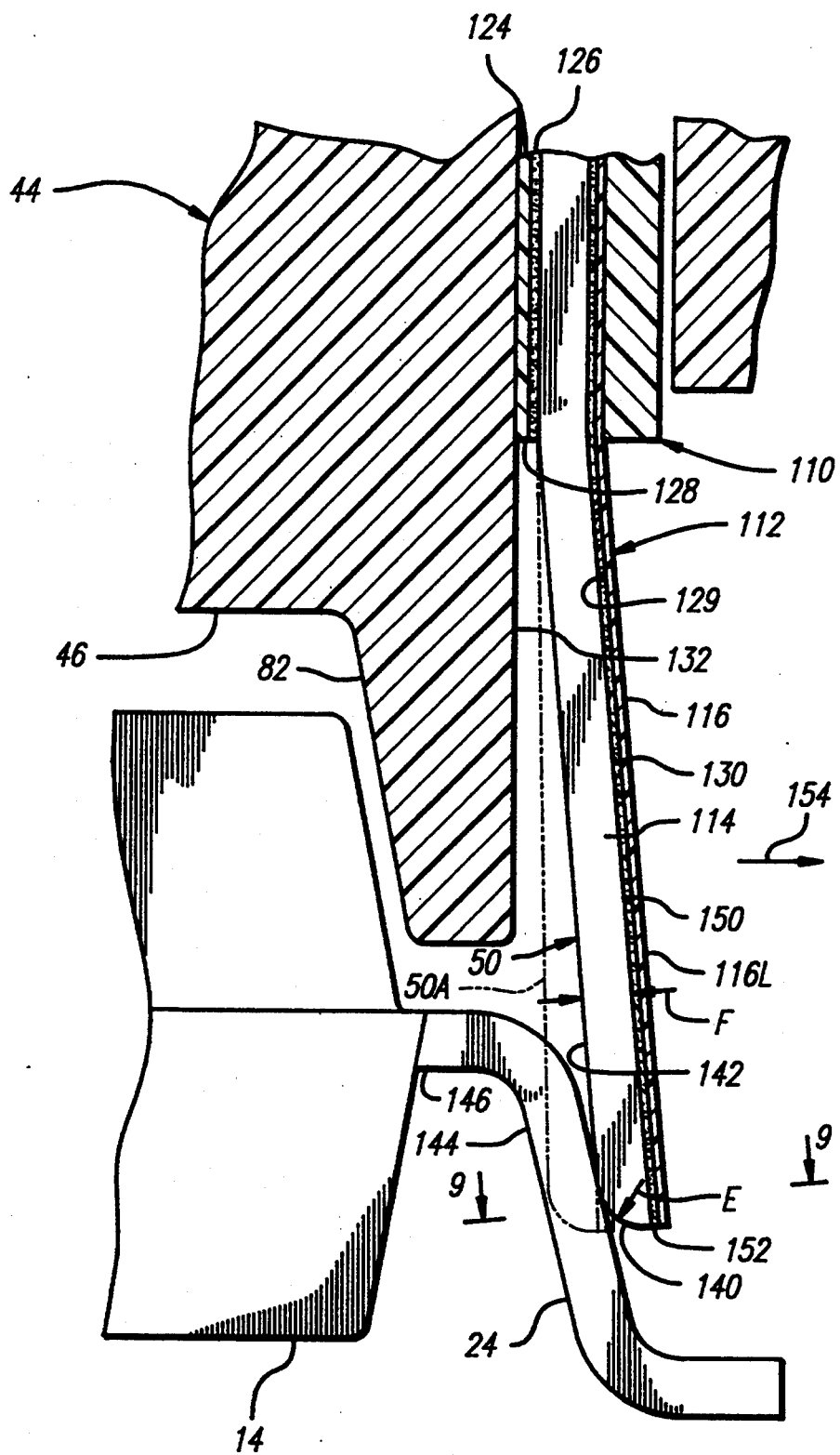
FIG. 8 is an enlarged sectional end view of a portion of the clip of FIG. 3, showing the manner in which a contact engages a lead of the IC device.

FIG. 8 shows the construction of the lower part of the contact arrangement 110. The flat flexible cable includes a thick film or sheet 124 adhered by an adhesive layer 126 to the inner side of the conductors, but with the bottom 128 of the sheet lying above the lower end portions or contacts 50 of the conductors. The carrier film 116, which lies on the outer side of the conductors, has an inner surface 129 that is adhered by a thin film 130 of adhesive to the conductors. The flat cable is pressed against a flat primarily vertical surface 132 of the frame base, to position the cable so the conductor lower end portions 50 initially extend vertically as indicated at 50A. However, when the clip is lowered and the lower end of the contacts engage the leads 24, the contacts are deflected outwardly, until, at the lowermost position of the clip the contact has been deflected outwardly to the position shown in solid lines at 50. The inner side 140 of the contact bottom region 142, is rounded about a radius of curvature E which is preferably greater than one-third the thickness of the contact. Such rounding which extend along at least half of the conductor thickness, assures that the contact will outwardly deflect against the lead inclined portion 144 even if the contact initially engages a location near the intersection of the inclined part 144 and the upper part 146 of the lead, or if there is a deflect in the lead surface. It may be noted that the person installing the clip may shift it slightly from side to side while pressing it down, to insure that the contacts 50 will be outwardly deflected by the leads.

The fact that the exposed lower end portions or contacts 50 are bound together at their outer surfaces 150 by the lower end portion 116L of the carrier film 116, has advantages and disadvantages. The major advantage is that the carrier film resists permanent deformation of each contact 50, which could occur during handling prior to connection to an IC device, or during downward movement of the clip in the course of connection to the IC device. If one of the contacts 50 is deflected sidewardly by much more than adjacent contacts, the carrier film 116 will be deflected and will support the contact 50 on adjacent contacts. If the extreme lower end 152 of a contact is pushed upwardly so the contact tends to undergo column collapse, the carrier strip 116 will support that contact 50 on adjacent contact. The carrier film 116 prevents the thin edge of a part from being inserted horizontally between adjacent contacts 50 and longitudinally bending a contact. This is because the carrier film is devoid of slots or slits at its lower end of a substantial height (i.e. more than the contact thickness F or contact spacing H). It should be noted that each contact 50 has a relatively small thickness F such as about 0.1 mm (four thousandths inch) so a person could apply force that damages the contacts without realizing he is applying such force.

Figure 9:
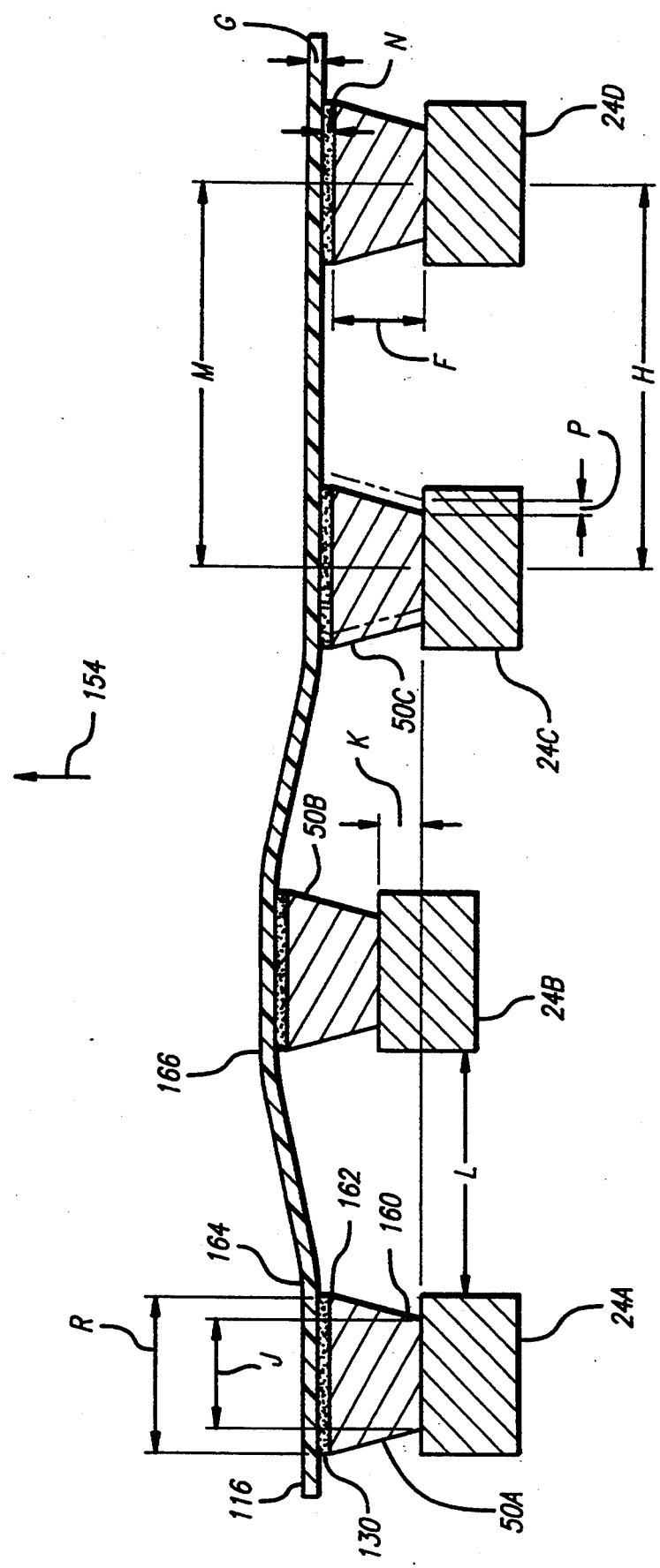
FIG. 9 is a view taken on the line 9—9 of FIG. 8, with one of the leads of the IC device being out of line with other leads.

If the carrier film 116 ended at the location 128 of the insulative sheet 124, the contacts 50 could be more easily deflected outwardly in the direction 154. The outward direction 154 is away from the clip axis 52 (FIG. 1) and from a longitudinally-extending plane 155 that extends through the clip axis. Deflection of a contact 50 (FIG. 8) by more than adjacent contacts require bending of the carrier film 116, which the film resists. Of course, the ability to cause differential outward deflection of different contacts 50 is very important in making sure that each contact engages a corresponding lead, even though the leads are not aligned. FIG. 9 shows such a situation, where one lead 24B lies further outward in the direction 154 (relative to the clip axis) than adjacent leads 24A and 24C, resulting in the need for contact 50B to deflect further than adjacent contacts 50A, 50C. Applicant minimizes the resistance created by the carrier film 116 to differential outward deflection of the contacts, by making the carrier film 116 unusually thin, and of a very tough flexible dielectric material. Also, applicant constructs each of the contacts 50 with a thickness F that is a plurality of times greater than the thickness G of the carrier film.

Previous flat flexible cables had conductors of a thickness of about 0.075 mm or 3 mil (1 mil equals one thousandths inch) and were supported by sheets having a thickness of about 0.05 mm or 2 mil, with an adhesive layer between them of about 0.025 mm or 1 mil. Thus, prior flat flexible cables had conductors with a thickness about fifty percent greater than the thickness of the carrier sheet. Applicant minimizes the effect of the carrier film 116 on differential contact deflection, by making the carrier film very thin and the contact very thick, with a thickness at least three times that of the carrier film. Applicant has made provisions with suppliers of flat flexible cable carrier sheets to provide carrier sheets much thinner than usual, and has been able to obtain carrier sheets of Kapton having a thickness G of 1 mil, with sheets as thin as 0.75 mil and even 0.5 mil appearing likely to be achieved in the tough Kapton material.

The contacts 50 are formed of a stiff material, preferably beryllium copper, and have a maximum thickness F. The contacts 50 are formed by photo etching (which is the process used to make the leads of the IC device). This process results in the inner end 160 of the contact being narrower than the outer end 162 (which is subjected to etching for a shorter period of time). For a given center-to-center contact spacing H such as 0.5 mm (20 mil) and minimum contact width J such as 7 mils (0.18 mm) (and maximum width R of 12 mils) there is a limited contact thickness F which can be readily obtained while assuring reliable separation of the contacts. The very thin carrier film 116 easily bends at locations such as 164, 166 where bending is required to enable differential deflection of the contacts. The relatively large thickness F of the contacts allows them to resist outward deflection caused by the carrier film 116. The combination of very thin carrier film and very thick contact, enables largely independent deflection of the contacts. This is especially true because the stiffness against bending of a sheet or beam is proportional to the cube of its thickness. Thus, by reducing the thickness of the carrier sheet from 2 mils to 1 mil or less, applicant reduces its resistance to bending to one eighth of its original resistance. Also, by applicant increasing the thickness F of each beam from about 3 mils to 5 mils, applicant has increased the stiffness of each beam to bending by more than four times.

It may be noted that each beam is held by a film 130 of adhesive to the carrier sheet. The adhesive 130 is formed of a material preferably having a very low modulus of elasticity which is preferably less than one tenth that of the carrier film. In that case, the presence of the adhesive film would have negligible effect even if the adhesive extended in a continuous film between conductors, so long as its thickness was not much greater than that of a carrier film. Applicant prefers to not have adhesive between conductors. If the adhesive extends between conductors and has a high modulus of elasticity so it at least doubles the stiffness of the combined carrier and adhesive films, then its thickness is of importance. In that case, applicant prefers that the thickness F of the contact be a plurality of times greater than the combined thickness G+N of the carrier sheet and adhesive.

FIG. 9 shows a situation where one of the leads 24B lies a distance K such as 2.5 mils (0.063 mm) further outward than adjacent leads. In that case, the very thin carrier film will accommodate corresponding deflection of contact 50B by bending at the locations 164, 166, with very low resistance to such bending. However, the tensile strength of the carrier film will result in the adjacent contact such as 50C being moved longitudinally towards the conductor 50B by a small distance P (equal to 0.26 mil where the deflection distance K is 2.5 mils and the contact separation L is 12 mils). Where there are a large number of leads and corresponding contacts, the accumulation of such slight shortening of the distance between contacts can be significant. Applicant may make the distance M between adjacent conductors, slightly greater than the distance H between adjacent leads, to account for such shortening. Where the lead spacing H is 20 mil, the contact spacing M may be, perhaps, 20.25 mil, on average.

Figure 12:
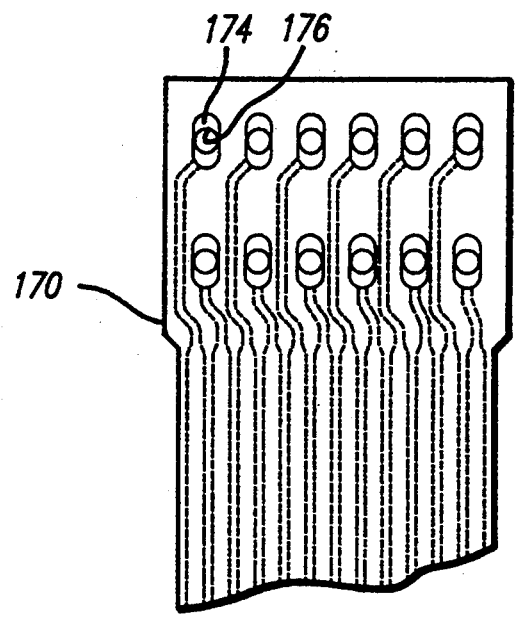
FIG. 12 is a view taken on the line 12—12 of the contact arrangement of FIG. 10.

Applicant connects the upper end of the flat cable conductor directly to the terminals 120 (FIG. 10) of the header 122. The upper end 170 of the flat cable 112 lies against the rear or inner surface 171 of the header housing 172, with the pin terminals 120 projecting through holes of the conductors. FIG. 12 shows the upper end of the cable, with each conductor being enlarged at 174 to form a solder pad, and with each conductor having a hole 176 that receives a corresponding header terminal, with the conductors and terminals being soldered together. The contact assembly which includes the cable and header is mounted, as shown in FIG. 3 at 110, with the cable 112 lying against the flat primarily vertical surface 132 of the frame base 60. The flat vertical surface lies adjacent to an upward extension of the cavity side wall 82. The lower portion of the header upper cable portion which lies against the rear or inner end of the header housing 172, lies facewise against the largely vertical surface 132. The top of the header housing with the upper cable portion therebehind, lies against a surface of the frame upper part 64. The top of the hood 62 and bottom of the frame upper part 64 have flanges 180 which capture the header. When the bolt 70 is screwed down tight, the header is firmly captured in place. The cable 112 is pressed against the largely vertical face surface 132 by a set screw 182. This arrangement avoids bending of the flat cable, so that the sheet on the inner side of the conductors can be thick and of low cost because it does not have to flex. Also, the construction of the contact assembly and frame is simplified.

Figure 13:
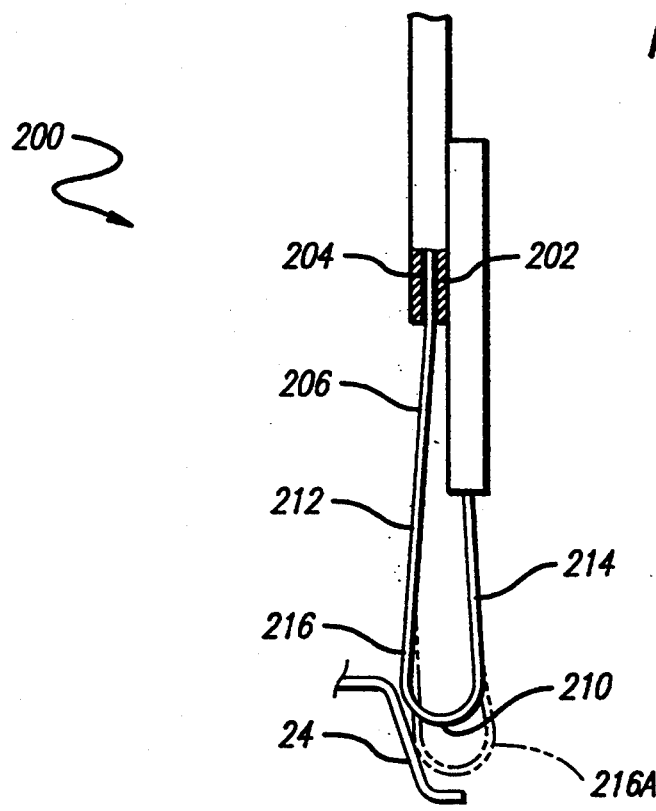
FIG. 13 is an end view of a portion of a contact arrangement constructed in accordance with another embodiment of the invention, showing the manner of its engagement with the lead of an IC device.

FIG. 13 illustrates another contact arrangement 200 which includes a length of flat cable that has relatively thick insulative sheets 202, 204. However, the lower portions of the cable conductors which form contacts 206, are not covered on their inner or outer surfaces by the carrier sheets. The carrier sheets are removed from a length of the cable, and the cable is bent in a substantially 180° loop. This results in the bottom 210 of the contact being devoid of lower edges that could catch on other parts, especially if not rounded, and it results in the opposite sides 212, 214 of the looped contact 206 supporting one another. When the cable is lowered, the bottom part 216 of the contact is deflected outwardly against a device lead 24, as indicated at 216A. An important disadvantage of the arrangement of FIG. 13, is that the space between the bottoms 216 of adjacent contacts is not blocked, as by the thin carrier sheet 116 of FIG. 9. Also, the lack of a carrier sheet coupling the bottoms of adjacent contacts results in contacts not resisting large deflection of an adjacent contact.

Although terms such as "vertical", "upper", "lower", etc. have been used herein to aid in describing the invention as illustrated, it should be understood that the clip can be used in any orientation with respect to gravity, although it is most commonly used in approximately the orientation shown in the drawings.

Thus, the invention provides a clip for connection to the leads of an IC device, especially where the leads are very closely spaced. The frame of the clip has cavity walls that closely locate the body of the IC device without locking to it. At least one pivoting arm locks, or firmly holds, to the lower part of an end of a SOP type IC device, so that aligning and locking is accomplished by different parts of the clip. The contacts which engage the leads of the IC device are part of a flat cable where the conductors are formed by photo etching, to enable accurate very close contact spacing of 1 mm or 0.5 mm or less. With the lower portions of the conductors, or contacts, exposed at least at their inner side to engage the leads, the outer sides of the contacts are preferably supported by a film of tough flexible material which is extremely thin and with the conductors being thick. The conductors are at least three times as thick as the film. The flat cable has an upper part directly attached to a header, without a circuit board between them, and with the flat cable, including the part behind the lower portion of the header, backed by a largely vertical flat wall surface of the frame.

Although particular embodiments of the invention have been described and illustrated herein, it is recognized that modifications and variations may readily occur to those skilled in the art, and consequently, it is intended that the claims be interpreted to cover such modifications and equivalents.

We claim:

1. A test clip arranged for relative downward motion over the top of an IC (integrated circuit) device for making connections to each lead of a row of longitudinally-spaced leads of the IC device, the leads extending as finger-like members outwardly and downwardly from at least one side of the body of the IC device, where the clip has a vertical axis and includes a frame and a contact arrangement that is mounted on said frame and that includes a row of longitudinally-spaced contacts having contact ends for pressing in a lateral inward direction to firmly engage said leads, characterized by:

said contact arrangement includes a flexible carrier film having an inner surface, and a longitudinally-extending row of vertically elongated conductors mounted on said film inner surface, said conductors having exposed lower end portions that include contact regions with inner surfaces for engaging said IC device leads and with opposite outer surfaces, and said carrier film having a lower end portion that is fastened to said outer surfaces of said conductor lower end portions at said contact regions, with said conductor lower end portions being substantially free of connection to each other at locations inward of their outer surfaces;

the center-to-center spacing of said conductor lower end portions in a longitudinal direction is no more than 1 mm, and the thickness of said film in a lateral direction is no more than 0.03 mm, to thereby minimize the lateral outward deflection force on a conductor lower end portion when an adjacent conductor lower end portion is deflected outwardly;

each of said conductor lower end portions has a thickness in said lateral direction which is at least three times said carrier film thickness, so each conductor lower end portion resists outward deflection.

2. The clip described in claim 1 wherein:

said conductors are metal strips remaining from an etched metal plate, and are formed of material having a Young's modulus of elasticity which is more than 10 times that of the material of said film, and each of said conductor lower end portions has a thickness in said lateral direction which is at least five times the thickness of said film.

3. The clip described in claim 1 wherein:

each of said conductor outer surfaces is flat; and including a quantity of adhesive bonding each of said conductor lower end portions to said film, with said adhesive bonded to substantially only said flat outer surfaces of said conductors, and with said adhesive having a Young's modulus of elasticity which is less than half that of the material of said film.

4. The clip described in claim 1 including:

the average center-to-center spacing of said conductor lower end portions is greater than said predetermined spacing of said leads.

5. The clip described in claim 1 wherein:

each of said conductor lower end portions extends primarily vertically along its entire length and has a bottom region at the extreme lower end of the contact, with said bottom region having an inner side that is rounded along at least half of the thickness of the conductor lower end portion.

6. A clip for connection to a connector and for connecting terminals of the connector to each lead of a row of longitudinally-spaced leads of an IC (integrated circuit) device that extend from a body of the device, where the clip includes a frame and a contact arrangement that is mounted on said frame and that includes a row of longitudinally-spaced contacts having contact ends for pressing in a lateral inward direction to firmly engage said leads, characterized by:

said contact arrangement includes a carrier film, a row of elongated conductors mounted on said film, said conductors having parallel longitudinally-spaced lower end portions with exposed surfaces for engaging said IC device leads, and said conductors having upper end portion;

said contact arrangement also including a header having a plurality of terminals for connection to said connector terminals, said header terminals each connected directly to one of said conductor upper end portions.

7. The clip described in claim 6 wherein said body of said IC device has first and second opposite sides, with said leads of said row extending generally sidewardly and downwardly from a first of said body sides, and wherein:

said frame has a base with a cavity having first and second opposite cavity side walls that lie close respectively to said first and second opposite body sides, to align said clip sidewardly on said body, said frame having a primarily vertical and flat surface lying adjacent to an upward extension of said cavity first side wall, with said contact arrangement having a flat cable that includes said carrier film and said row of conductors thereon with said flat cable lying facewise against said base vertical surface;

said frame also includes a hood mounted on said base with a hood wall lying opposite said base vertical wall and with said flat cable sandwiched between said hood wall and said base vertical wall, and with said header having a housing with an inner surface lying facewise against said flat cable.

8. The clip described in claim 7 including:

a screw threadably mounted on said hood and having an inner end that presses said flat cable against said base vertical wall.

9. A clip for connecting to the leads of an IC (integrated circuit) device that includes a body with a pair of largely vertical opposite sides and a pair of largely vertical opposite ends, where the IC device also includes two rows of spaced leads each projecting from a different one of said sides, wherein the test clip includes a frame and two rows of contacts for engaging said leads, characterized by:

said frame includes a base having a lower end forming a cavity, said base lower end having opposite laterally-spaced cavity side walls positioned to lie closely beside said sides of said IC device body, and said base lower end having opposite longitudinally-spaced cavity end walls positioned to lie closely beside said body ends and thereby closely align said test clip with said IC device body;

said clip includes at least a first lock arm pivotally coupled to said frame about a laterally extending axis, and a spring device urging said lock arm to pivot in a locking direction, said first lock arm having a lower end positioned to press firmly against a first of said body ends to lock said test clip to said body when said arm is free to pivot in said locking direction, said arm having a handle which can receive force to counter the force of said spring device and pivot said arm in an opposite release direction and thereby prevent said arm from pivoting in said locking direction and pressing against said body end.

10. The clip described in claim 9 including said IC device, with said ends of said IC device body each having upper and lower parts, with said lower parts extending primarily vertically but at angles from the vertical to converge in a downward direction, and wherein:

said cavity end walls lie adjacent to said upper parts of said body ends, and said lower end of said lock arm has a body-engaging surface positioned to engage only said lower part of a first of said body ends to lock thereto.

* * * * *